US006150980A

United States Patent [19]
Krasner

[11] Patent Number: 6,150,980
[45] Date of Patent: Nov. 21, 2000

[54] METHOD AND APPARATUS FOR DETERMINING TIME FOR GPS RECEIVERS

[75] Inventor: Norman F. Krasner, San Carlos, Calif.

[73] Assignee: SnapTrack, Inc., San Jose, Calif.

[21] Appl. No.: 09/342,299

[22] Filed: Jun. 29, 1999

Related U.S. Application Data

[63] Continuation of application No. 08/845,545, Apr. 24, 1992, Pat. No. 5,945,944, which is a continuation-in-part of application No. 08/842,559, Apr. 15, 1997, which is a continuation-in-part of application No. 08/612,582, Mar. 8, 1996, Pat. No. 5,874,914, which is a continuation-in-part of application No. 08/759,523, Dec. 4, 1996, Pat. No. 5,841,936.

[51] Int. Cl.$^7$ .............................. H04B 7/185; G01S 5/02
[52] U.S. Cl. .................................. 342/357.1; 342/357.06
[58] Field of Search ............................. 342/357.09, 357.1

[56] References Cited

U.S. PATENT DOCUMENTS 5,587,715  12/1996  Lewis .

*Primary Examiner*—Theodore M. Blum
*Attorney, Agent, or Firm*—Blakely, Sokoloff, Taylor & Zafman

[57] ABSTRACT

A method and apparatus of determining the time for a global positioning system receiver is disclosed. Timing signals derived from a communication system, such as cellular phone transmission signals, are received by a GPS receiver and decoded to provide accurate time information. The timing signals may be in the form of synchronized events marked by timing indicators, or as system time information. The timing signals in combination with satellite position signals received by the GPS receiver are used to determine the position, of the GPS receiver.

6 Claims, 9 Drawing Sheets

FIG. 7

CELLULAR BASED INFORMATION SERVICE 700

| SERVICE AREA | CELL SIZE # | SERVICE AREA # OR LOCATION | CELL SITE LOCATION | APPROXIMATE DOPPLER |
|---|---|---|---|---|
| A | - | LATITUDE/LONGITUDE A | - | DOPPLER SET A1 ($t_1$) <br> DOPPLER SET A2 ($t_2$) |
| B | 1 | LATITUDE/LONGITUDE B | LATITUDE/LONGITUDE B1 | DOPPLER SET B11 ($t_1$) <br> DOPPLER SET B12 ($t_2$) |
| B | 2 | LATITUDE/LONGITUDE B | LATITUDE/LONGITUDE B2 | DOPPLER SET B21 ($t_1$) <br> DOPPLER SET B22 ($t_2$) |

702  704  706  708  710

000
METHOD AND APPARATUS FOR DETERMINING TIME FOR GPS RECEIVERS

CROSS-REFERENCE TO RELATED APPLICATIONS

This application is a continuation of U.S. application Ser. No. 08/845,545, filed Apr. 24, 1997, which is now U.S. Pat. No. 5,945,944.

The present application is related to and is a continuation-in-part of the following co-pending U.S. patent applications:

U.S. patent application entitled, "An Inproved GPS Receiver Utilizing a Communication Link", having application Ser. No. 08/842,559, and filed on Apr. 15, 1997 by Norman F. Krasner; U.S. patent application entitled "An Improved GPS Receiver Utilizing a Communication Link," having Ser. No. 08/612,582, filed on Mar. 8,1996 now U.S. Pat. No. 5,874,914; and U.S. patent application entitled "An Improved GPS Receiver Utilizing a Communication Link," having Ser. No. 08/759,523, filed on Dec. 4, 1996 now U.S. Pat. No. 5,841,396, which are assigned to the assignee of the present invention.

FIELD OF THE INVENTION

The present invention relates generally to the field of satellite positioning systems (SPS), and more particularly to providing timing information to satellite positioning system receivers.

BACKGROUND OF THE INVENTION

Satellite Positioning System receivers normally determine their position by computing relative times of arrival of signals transmitted simultaneously from a multiplicity of satellites such as GPS (or NAVSTAR) satellites. For example, the U.S. Global Positioning System (GPS) Orbital Constellation consists of 24 satellites which orbit the earth in 12 hour orbits. The satellites are arranged in six orbital planes each containing four satellites. The orbital planes are spaced 60 degrees apart from each other and are inclined approximately fifty-five degrees with respect to the equatorial plane. This constellation provides a user with approximately five to eight satellites visible from any point on earth. These satellites transmit, as part of their message, both satellite positioning data, so-called "ephemeris" data, as well as clock timing data. In addition, the satellites transmit time-of-week (TOW) information associated with the satellite signal, which allows the receiver to unambiguously determine local time. The process of searching for and acquiring GPS signals, reading the ephemeris and other data for a multiplicity of satellites and then computing the location of the receiver (and accurate time-of day) from this data is time consuming, often requiring several minutes of time. In many applications, this lengthy processing time introduces unacceptable delays, and furthermore, greatly limits battery life in portable applications utilizing miniaturized circuitry.

In addition, in many situations there may be blockage of the satellite signals. In these cases, the received signal level from the GPS satellites can be too low to demodulate and derive the satellite data signals without error. Such situations may arise in personal tracking and other highly mobile applications. In these situations, it is usually possible for a receiver to continue to acquire and track the GPS signals. However, performing location and unambiguous time measurement without such data requires alternative methods.

It is therefore desirable to provide a system for providing time information to a GPS receiver without requiring the receiver to derive timing information from GPS signals received from GPS satellites or from an internally generated clock. It is further desirable to provide a system which derives timing information for GPS applications from timing signals contained in communications transmissions received by the receiver.

SUMMARY OF THE INVENTION

The present invention discloses a method and apparatus for acquiring timing signals for use in a Global Positioning System (GPS) receiver. In an embodiment of the present invention, the GPS receiver is contained in an integrated receiver which also includes a cell-based communication receiver. In a method of the present invention, the communication receiver receives a commercial communication signal which contains a time indicator representing a time synchronized event, and the GPS receiver receives satellite position information from one or more global positioning system satellites. The GPS receiver associates the time indicator with timing data at the receiver. If the time indicator is a timing frame or pulse within the communication signal, the receiver determines its local time relative to such a frame or pulse using, in one embodiment, a time interval counter. If the time indicator is system time transmitted along with the communication data, the receiver determines its local time from the transmitted system time. The satellite position information and timing information are then used to determine the position of the GPS receiver.

Other features of the present invention will be apparent from the accompanying drawings and from the detailed description which follows.

BRIEF DESCRIPTION OF THE DRAWINGS

The present invention is illustrated by way of example and not by way of limitation in the figures of the accompanying drawings in which references indicate similar elements and in which:

FIG. 7 is an exemplary representation of a cellular based information source which provides an association between sets of Doppler information at given times relative to cellular service areas.

DETAILED DESCRIPTION

Figure 1:
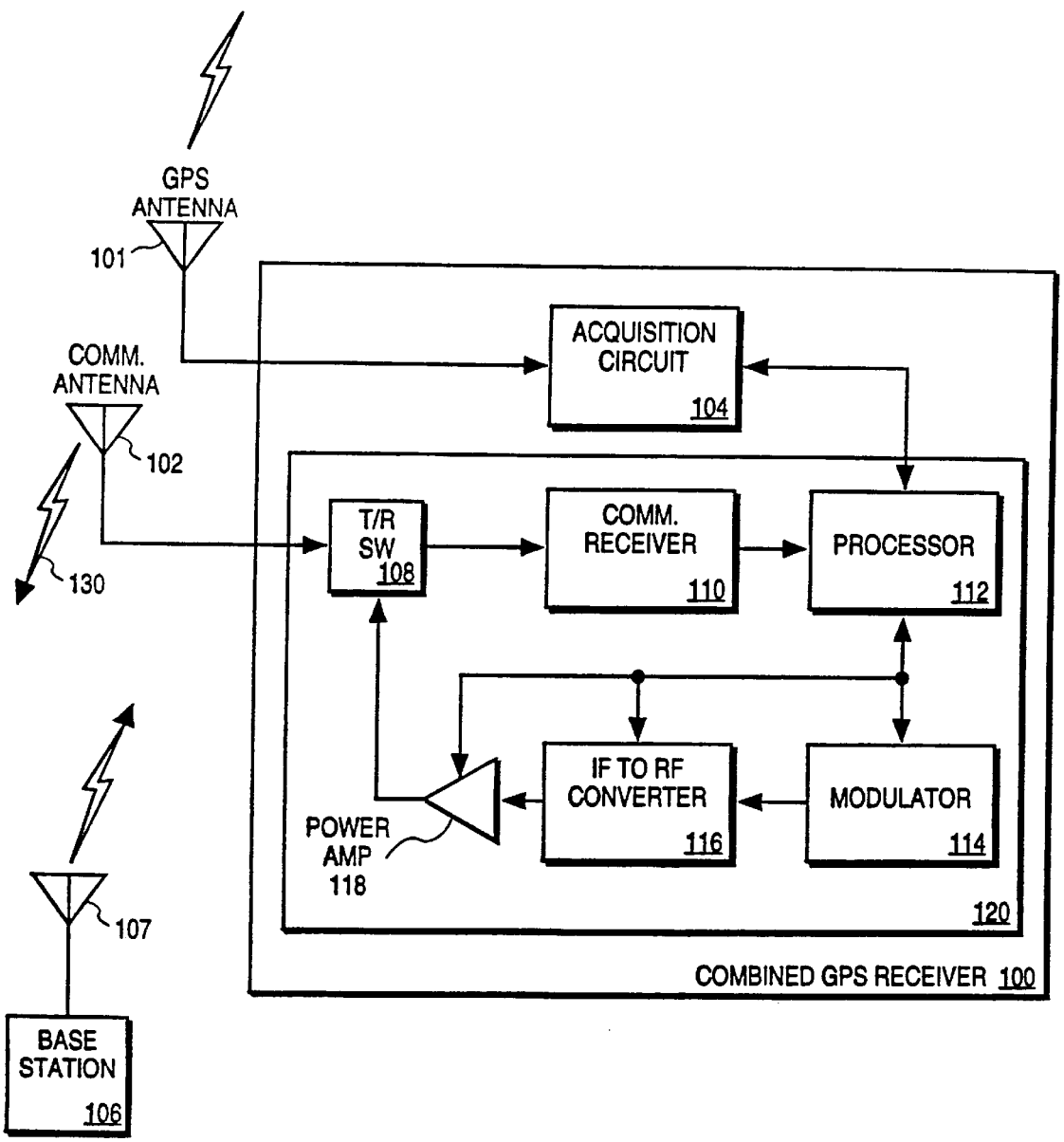
FIG. 1 is a block diagram representation of a portable communication system having a GPS receiver combined with a communication system which can establish a communication link with a basestation according to one embodiment of the present invention.

A method and apparatus for utilizing commercially available transmission signals to determine time information in global positioning system receivers is described. In the following description, for purposes of explanation, numerous specific details are set forth in order to provide a thorough understanding of the present invention. It will be evident, however, to one skilled in the art that the present invention may be practiced without these specific details. In other instances, well-known structures and devices are shown in block diagram form to facilitate explanation.

Global Positioning System (GPS) receivers receive GPS signals transmitted from orbiting GPS satellites and determine the times-of-arrival (TOA) of unique pseudo-random noise (PN) codes by comparing the time shifts between the received PN code signal sequences and internally generated PN signal sequences.

Each transmitted GPS signal is a direct sequence spread spectrum signal. The signal available for commercial use is that associated with Standard Positioning Service and utilizes a direct sequence bi-phase spreading signal with a 1.023 MHz spread rate placed upon a carrier at 1575.42 MHz (L1 frequency). Each satellite transmits a unique pseudo-random noise code (also referred to as the 'Gold' code) which identifies the particular satellite, and allows signals simultaneously transmitted from several satellites to be simultaneously received by a receiver, with little interference from one another. The pseudo-random noise (PN) code sequence length is 1023 chips, corresponding to 1 millisecond time period. One cycle of 1023 chips is called a PN frame. Thus, each received GPS signal in C/A (coarse acquisition) mode is constructed from the high rate 1.023 MHz repetitive PN pattern of 1023 chips. At very low received signal levels, the pseudo random pattern may still be tracked, or otherwise used, to provide ambiguous system timing by processing many PN frames (e.g., 1000 repetitions over 1 second). In this process, the GPS receiver essentially measures the start times of PN frames for a multiplicity of received GPS signals. These times are termed "pseudoranges", or more precisely, "ambiguous pseudoranges", if the times are only known modulo 1 millisecond PN frame boundaries. If the absolute times associated with these signals are known in some manner and are appended to the ambiguous pseudoranges, then true unambiguous pseudoranges, referred to simply as "pseudoranges", are created.

A set of four ambiguous pseudoranges together with a knowledge of absolute times of transmission of the GPS signals and satellite positions in relation to these absolute times is sufficient to solve for the position of the GPS receiver. It should be noted that precision position location requires that the time-difference between satellite transmissions received at the GPS receiver be measured very accurately, typically to within around ten nanoseconds. However, the absolute time of transmission from each satellite, or the absolute time of reception at the GPS receiver need not be known to such high accuracy. These absolute times need only be known to an accuracy of about one to ten milliseconds in order to maintain high precision. The absolute times of transmission (or reception) are needed in order to determine the positions of the GPS satellites at the times of transmission and hence to compute the position of the GPS receiver. For example in a period of one millisecond, the GPS satellites move only about 3.9 meters and, more importantly, change their distance from a point on earth no more than about 2.7 feet. In typical situations this movement only results in position location errors on the order of one meter. The time information of interest in the present invention is the local time at the GPS receiver. Hence, for most applications, knowledge of this time to an accuracy of one to ten milliseconds is sufficient.

Superimposed on the 1.023 MHz PN code is low rate data at a 50 Hz rate. This 50 Hz signal is a binary phase shift keyed (BPSK) data stream with bit boundaries aligned with the beginning of a PN frame. There are exactly 20 PN frames per data bit period (20 milliseconds). The 50 Hz signal modulates the Navigation Message which consists of data bits which describe the GPS satellite orbits, clock corrections, time-of-week information, and other system parameters. The absolute time associated with the satellite transmissions are determined in conventional GPS receivers by reading data contained within the Navigation Message of the GPS signal. In the standard method of time determination, a conventional GPS receiver decodes and synchronizes the 50 baud data bit stream. The 50 baud signal is arranged into 30-bit words grouped into subframes of 10 words, with a length of 300 bits and a duration of six seconds. Five subframes comprise a frame of 1500 bits and a duration of 30 seconds, and 25 frames comprises a superframe with a duration of 12.5 minutes. The data bit subframes which occur every six seconds contain bits that provide the Time of Week to six second resolution. The 50 baud data stream is aligned with the C/A code transitions so that the arrival time of a data bit edge (on a 20 millisecond interval) resolves the absolute transmission time to the nearest 20 milliseconds. Precision synchronization to bit boundaries can resolve the absolute transmission time to around one millisecond or less. In the standard time derivation method, the signal-to-noise ratio measured over one data period (20 milliseconds) must be above approximately 12 dB, otherwise errors will result when attempting to accurately demodulate this data signal and read system time unambiguously from the message. In low signal-to-noise ratios (less than 12 dB) an alternative solution is required to accurately and reliably determine absolute time.

According to one embodiment of the present invention, unambiguous receiver timing for a GPS receiver is established by receiving a suitable signal containing a timing indicator over a communication link. This approach differs from conventional GPS processing, in that the time established by this method is the time of receipt of communication signals by the GPS receiver, rather than the time of transmission of GPS signals from the satellites. Nevertheless, if the position of the GPS receiver is known, even coarsely (e.g. to 100 miles accuracy), knowledge of receiver time together with satellite orbital information establishes the satellite transmission time to high accuracy (typically, 1 millisecond or better).

According to a method of the present invention, the timing signals are derived from the framing structure or timing data transmitted by commercially available telecommunications signal, such as cellular voice or data signals which carry information in addition to the timing signals.

GPS Receiver

FIG. 1 is a block diagram illustration of a portable communication receiver which combines a communication transceiver with GPS receiver for use in one embodiment of the present invention. The combined mobile unit 100 includes circuitry for performing the functions required for processing GPS signals as well as the functions required for processing communication signals received through a communication link. The communication link, such as communication link 130, is typically a radio frequency communication link to another component, such as a basestation 106 having a communication antenna 107.

GPS receiver 100 is a combined GPS and communication receiver and transmitter. Receiver 100 contains a GPS receiver stage including acquisition circuit 104 and communication transceiver section 120. Acquisition circuit 104 is coupled to GPS antenna 101, and communication transceiver 120 is coupled to communication antenna 102. GPS signals are received through GPS antenna 101 and input to acquisition circuit 104 which acquires the PN codes for the various received satellites. The pseudorange data produced by acquisition circuit 104 are processed by processor 112 for transmittal by transceiver 120. Communication transceiver 120 contains a transmit/receive switch 108 which routes communication signals (typically RF) to and from communication antenna 102 and receiver 100. In some systems, a bandsplitting filter, or "duplexer," is used instead of the T/R switch. Received communication signals are input to communication receiver 110 and passed to processor 112 for processing. Communication signals to be transmitted from processor 112 are propagated to modulator 114 and frequency converter 116. Power amp 118 increases the gain of the signal to an appropriate level for transmission to basestation 106. In the combined GPS/communication system of receiver 100, pseudorange data generated by acquisition circuit 104 is transmitted over communication link 130 to basestation 106. Basestation 106 then determines the location of receiver 100 based on the pseudorange data from the remote receiver, the time at which the pseudoranges were measured, and ephemeris data received from its own GPS receiver or other sources of such data. The location data can then be transmitted back to GPS receiver 100 or to other remote locations. The communication link 130 between receiver 100 and basestation 106 may be implemented in a number of various embodiments including a direct link or cellular telephone link.

Figure 2:
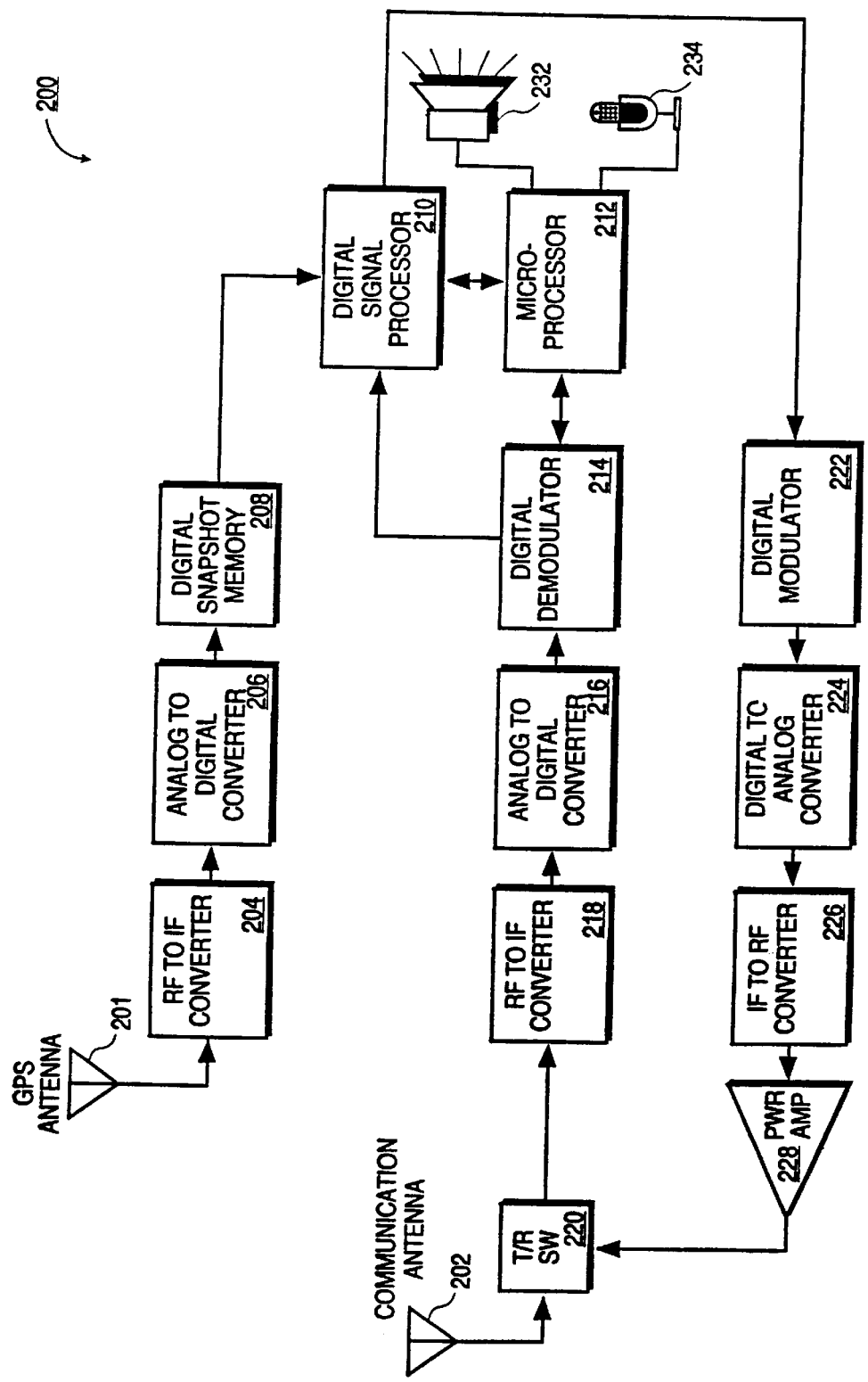
FIG. 2 is a block diagram representation of a portable communication system having a GPS receiver combined with a communication system according to an alternative embodiment of the present invention.

FIG. 2 is a more detailed block diagram illustration of a mobile communication receiver which combines a communication transceiver with GPS receiver for use in one embodiment of the present invention. The combined mobile unit 200 includes a GPS receiver stage and GPS antenna 201 as well as a communication transceiver stage and a communication antenna 202, and will be referred to hereinafter as the "combined GPS/communication receiver".

A received GPS signal is input from GPS antenna 201 to a radio frequency (RF) to intermediate frequency (IF) converter 204. Frequency converter 204 translates the signal to a suitable intermediate frequency, for example 70 MHz. It then provides a further translation to a lower intermediate frequency, for example 1 MHz. Each converter within the RF to IF converter 204 typically consists of a filter, an amplifier and a mixer. The components of the first converter are normally of a sufficiently wide band to encompass a wide frequency range (for example 800 to 2000 MHz) and for most cases are sufficiently broad band to handle the frequency ranges spanned by the GPS signals and the most important communication signals.

The output of the RF to IF converter 204 is coupled to the input of an analog to digital (A/D) converter 206, which digitizes the output signals from the RF to IF converter 204. In some implementations, the RF to IF converter 204 provides a pair of outputs that are in phase quadrature; in such cases, two A/D converters may be employed. The output from the A/D Converter 206 is coupled to an input of the digital snapshot memory 208 which can store a record of the data to be processed. In some cases this digital snapshot memory 208 may be bypassed and the data sent directly to the processor component 210 (which may be a digital signal processing (DSP) chip as shown, or a set of digital processing chips) if the data rate output from the A/D converter 206 is sufficiently low. The snapshot memory 208 is typically used in processing the GPS signals which are typically stored in a separate memory device coupled to DSP 210. The snapshot memory 208 is also normally employed for communication signals that are packetized, that is, signals consisting of bursts of data bits followed by long periods of inactivity. This is the primary form of communication signaling envisioned to be used with the present invention. However, continuous signaling, such as many cellular type signals, may be processed in a continuous manner by the DSP 210.

The communication stage of the combined GPS/communication receiver 200 includes a receiver stage and a transmitter stage coupled to communication antenna 202 through transmit/receive (T/R) switch 220. when a communication signal, such as a cellular telephone signal, is received from a communication basestation such as basestation 117 in FIG. 1, T/R switch 220 routes the input signal to frequency converter 218. Frequency converter 218 translates the communication signal to a suitable intermediate frequency for further processing. The output of the RF to IF converter 218 is coupled to the input of an analog to digital (A/D) converter 216, which digitizes the output signals from the RF to IF converter 218. From A/D converter 216, the signal is passed through digital demodulator 214 which demodulates the communication signal in order to determine the commands in the communication signal or other data in the communication signal (e.g., Doppler data or data representative of ephemeris of satellites in view).

In one embodiment of the present invention, output from demodulator 214 is passed to DSP 210 and microprocessor 212. Microprocessor 212 performs processing required for the communication receive and transmit functions, while DSP 210 performs the processing required for the GPS functions. In an alternative embodiment of the present invention, DSP 210 and microprocessor 212 may be incorporated in a single processor device or programmable logic circuit such as an Application Specific Integrated Circuit (ASIC). Voice data received through the communication stage of the combined receiver 100 is output through an output device, such as speaker 232 coupled to microprocessor 212. Command or GPS data received over the communication stage of the combined receiver is passed to DSP 210 either directly from digital demodulator 214 or through microprocessor 212.

When a transmission is required through the communication link, DSP 210 generates the data to be transmitted and baseband digital samples of the signal. It then uses this data to modulate a carrier signal using digital modulator 222. Such modulation is often a digital type, such as frequency shift keying or phase shift keying. Analog modulation, such as frequency modulation, may also be used. The modulated signal is converted from digital to analog in D/A converter 224. The carrier frequency at which the modulation is performed in digital modulator 222 may or may not be at the final RF frequency of the communication signal; if it is at an intermediate frequency (IF), then an additional IF to RF converter 226 is employed to translate the signal to a final RF frequency for the communication signal. A power amplifier 228 boosts the signal level, and this boosted signal is then transmitted to the communication antenna 202 through T/R switch 220, whose purpose is to isolate the sensitive receiver stage from the strong signal levels output from the power amplifier 228. In this manner, a communication signal containing data representative of position information (e.g., pseudoranges to various satellites, or a latitude and longitude of the combined GPS/communication receiver 200) is transmitted to a basestation, such as basestation 117, through communication link 130. Basestation 117 may serve as a processing site for computing the position information of the portable GPS unit, or it may serve as a relay site and retransmit the information received from the portable GPS unit. Voice data to be transmitted through the transmitter stage of combined GPS/communication receiver 200 is received through microphone 234 coupled to microprocessor 212.

It should be noted that T/R switch 220 is appropriate for signaling formats in which simultaneous transmission and reception are not required, as, for example, in Time Division Multiple Access (TDMA) cellular phone systems. When simultaneous transmission and reception is required, as in Frequency Division Multiple Access (FDMA) or spread spectrum Code Division Multiplexing (CDMA), the T/R switch 220 is replaced by two band splitting filters, such as in a circuit called a "duplexer".

According to an alternative embodiment of the present invention, a power management circuit may be implemented using power management algorithms stored in a memory coupled to processor 212. These algorithms control power transmission and provide a controlled power signal for devices, such as the power amplifier 228, the converter 226 and the modulator 22 such that after transmission of a communication signal, these devices enter a reduced power state. These components typically remain in this reduced power state until a further transmission through the communication link is required. A typical example of this embodiment is a two-way pager system where the combined GPS/communication receiver performs the functions of a two-way receiver and transmitter, and the transmitter is turned off (or otherwise consumes reduced power) when the transmitter stage is not transmitting.

In a further embodiment of the present invention, a single antenna for both the GPS signals and communication signals is provided rather than separate antennae 201 and 202. A single antenna may be used if the GPS and communication signals are closely spaced in frequency. In this embodiment, the signal from the single antenna is input to a preselect filter and a switch which selects the appropriate signal for transmission through the receiver circuit. The switch inputs GPS signals to the GPS receiver circuitry when GPS signals are received, and it inputs and outputs communication signals to the communication transceiver circuitry when communication signals are being received or transmitted.

Figure 3:
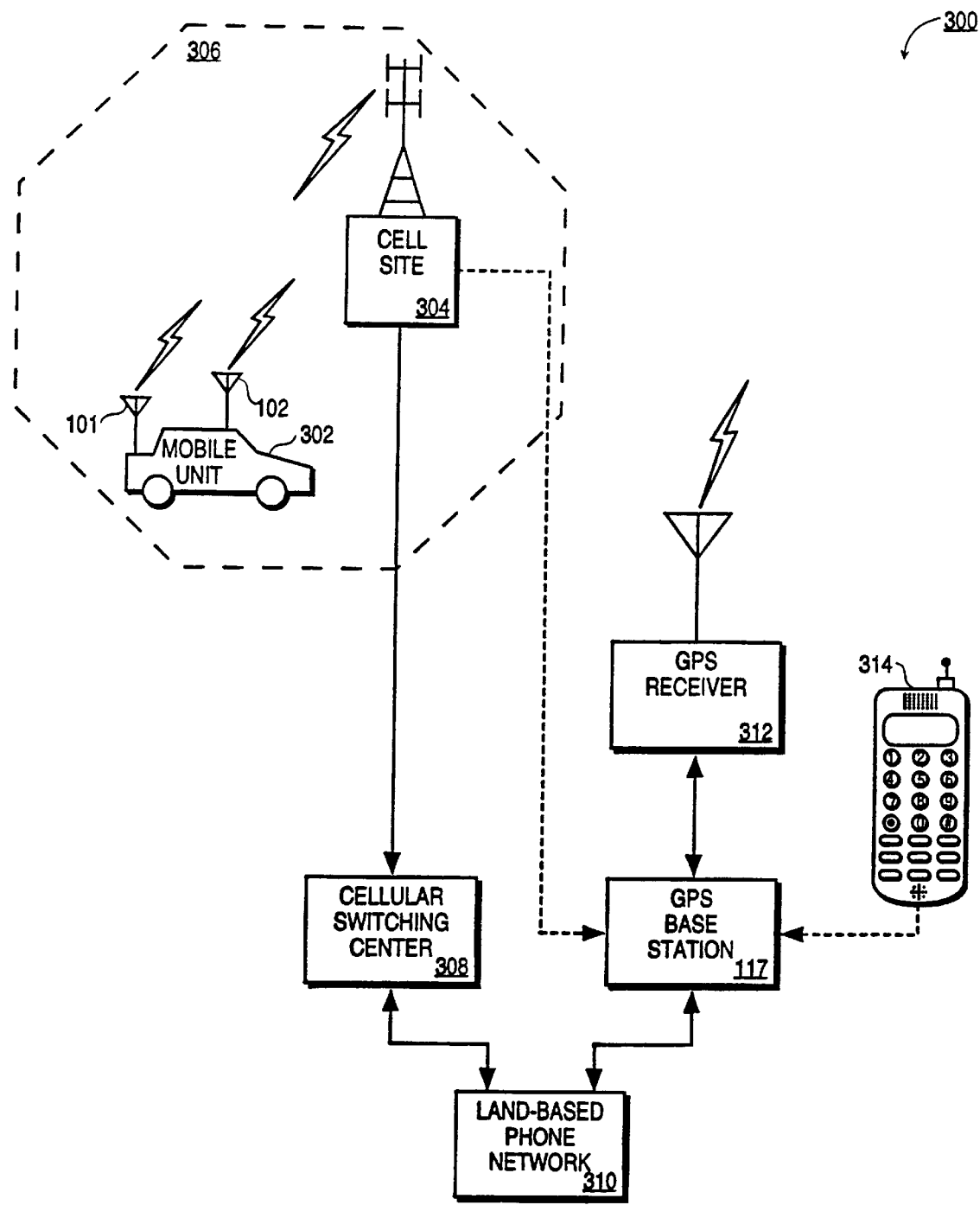
FIG. 3 illustrates a combined communication and GPS receiver utilized in a cellular telephone network.

FIG. 3 illustrates the utilization of the combined GPS/communication receiver in the context of a cellular telephone network to form a combined GPS and cellular system 300. Area 306 represents a cellular telephone cell which is served by cell site 304. Cell site 304 transmits and receives cellular telephone signals to and from cellular phones and receivers, such as mobile unit 302, within cell 306. Mobile unit 302 contains a combined GPS/communication receiver, such as combined unit 100 in FIG. 1. Mobile unit 302 communicates cellular signals to cell site 304 through communication antenna 102, and receives GPS signals from GPS satellites through GPS antenna 101. Cell site 304 transmits cellular transmissions from mobile units within cell 306 to a land-based phone network 310 through cellular switching center 308. Cellular switching center 308 transmits communication signals received from mobile unit 302 to the appropriate destination. Cellular switching center 308 may service several other cells in addition to cell 306. If the destination of the signal transmitted by mobile unit 302 is another mobile unit, a connection is made to the cell site that covers the area in which the called mobile unit is located. If the destination is land-based, cellular switching center 308 connects to land-based phone network 310.

It should be noted that a cellular based communication system is a communication system which has more than one transmitter, each of which serves a different geographical area, which is predefined at any instant in time. Typically, each transmitter is a wireless transmitter which serves a cell which has a geographical radius of less than 20 miles, although the area covered depends on the particular cellular system. There are numerous types of cellular communication systems, such as cellular telephones, PCS (personal communication system), SMR (specialized mobile radio), one-way and two-way pager systems, RAM, ARDIS, and wireless packet data systems. Typically the predefined different geographical areas are referred to as cells and a number of cells are grouped together into a cellular service area, and these number of cells are coupled to one or more cellular switching centers which provide connections to land based telephone systems and/or networks. Service areas are often used for billing purposes. Hence, it may be the case that cells in more than one service area are connected to one switching center. Alternatively, it is sometimes the case that cells within one service area are connected to different switching centers, especially in dense population areas. In general, a service area is defined as a collection of cells within close geographical proximity to one another. Another class of cellular systems that fits the above description is satellite based, wherein the cellular base-stations are satellites that typically orbit the earth. In these systems, the cell sectors and service areas move as a function of time. Examples of such systems include the Iridium, Globalstar, Orbcomm and Odyssey systems.

In the system illustrated in FIG. 3, the GPS position information transmitted by mobile unit 302 is transmitted to GPS server basestation 117 through land-based phone network 310. GPS basestation 117 serves as the processing site for computing the position of the GPS receiver in remote unit 302. GPS basestation 117 may also receive GPS information from satellite signals received in GPS receiver 312. GPS basestation 117 may also receive cellular communication signals corresponding to the cellular communication signals received by the combined GPS/communication receiver in mobile unit 302. This allows GPS basestation 117 to match the communication timing indicators with the timing indicators received from the combined GPS/communication receiver through the cell and land-based phone network 310 link. GPS basestation 117 may be directly linked to cell site 304 through a land-line or radio link to receive the corresponding cellular communication signals. Alternatively, GPS basestation 117 may receive the corresponding cellular communication signals from a cellular phone 314 which receives these signals and provides them to GPS basestation 117. The communication signal's timing indicators are received at the GPS basestation 117 and are time stamped. When a time indicator is transmitted from the mobile unit 302, the basestation can match the transmitted time indicator (e.g., a frame number in the cellular communication signal as explained below) to a time stamped time indicator stored at the GPS basestation 117. In doing so, the GPS basestation 117 can determine the time of receipt of GPS signals at the mobile unit 302.

It should be noted, that the cellular network system 300 of FIG. 3 represents one embodiment of the utilization of the present invention, and that other communication systems other than a cellular telephone network, may be used to transmit GPS signals from a mobile unit to a GPS basestation.

Determination of Time

Many modern telecommunications systems contain precision timing signals that allow a multiplicity of users to communicate within the same signal band without significantly interfering with one another. Such timing signals are also used to specify epochs in which a separate control signal is transmitted. In a typical system, the basic unit of time is termed a "frame" and each frame contains one or more slots of time containing user data or control data. For example, the pan-European digital cellular standard, GSM (Global System for Mobile Communications), utilizes frames of duration approximately 4.6 milliseconds made up of 8 slots of information. In the United States, the spread spectrum cellular telephone standard is the North American CDMA (Code Division Multiple Access) standard (IS-95). This system uses 20 millisecond frames for sending voice traffic and a separate 26.67 millisecond synchronization channel. Another North American cellular telephone standard is the IS136 TDMA standard, which uses 40 millisecond frames.

In the frame-based cellular telephone systems, a collection of frames are often grouped together to form a multiframe, successive multiframes may be grouped to form a superframe, and collections of superframes may be grouped together to form a hyperframe. The organization of these frames is termed a hierarchy. In the European GSM system, the superframe period is approximately 6.12 seconds. Each communication device using such a system is normally aware of the system tiling by synchronizing to special unique words or patterns that are transmitted by a controlling element of the network, typically a cell site basestation. In other cellular systems, such as the North American CDMA system, the actual system time is precisely transmitted as a message. In the North American CDMA system, the system time is transmitted in a special channel called a "synchronization channel".

In other cellular phone systems, such as analog cellular phone systems, frames may not be used as the synchronizing event in the communication signal. In these systems, time pulses may be superimposed or transmitted with the data stream to provide the synchronizing time indicator.

Alternative GPS Receiver Configurations

An embodiment of the present application has been discussed with regard to a particular GPS receiver configuration. However, as will be apparent to those of ordinary skill in the art, several different GPS receiver configurations exist which may take advantage of the time determination methods of the present invention.

One such alternative embodiment is a conventional GPS receiver. A conventional GPS receiver may be aided by knowledge of local time during its initial search for in-view satellites. As an example, conventional receivers collect over a period of time, coarse satellite position versus time data, or so-called Almanac data. This enables the receiver to determine satellites in view and their respective Doppler, if the receiver has a rough knowledge of its location and its local time. Without the local time, the appropriate Doppler cannot be computed and the initial acquisition of the first GPS satellite is typically very lengthy.

A further alternative embodiment of the present invention involves a GPS receiver in which a communication link is utilized for transmission of satellite position data versus time (so-called ephemeris data), such as that disclosed in U.S. Pat. No. 4,445,118 to Taylor et al. Such a receiver may rapidly determine its position, or alternatively determine its position at low input signal-to-noise ratios, without directly reading the satellite data messages from the received GPS signals. The knowledge of local time in such situations is necessary in order to compute the position of the GPS satellites at the time of transmission or reception of the GPS signals. Without such time knowledge, the positioning error, due to incorrect satellite location, may be large, especially if there are long latencies in the communication link.

A yet further alternative embodiment involves a GPS receiver in which only relative times of arrival from the GPS satellites, or so-called pseudoranges, are measured at the GPS receiver and in which such pseudoranges are transmitted over a communication link to a remote processing station (a "server") to complete the computation, as in U.S. Pat. No. 4,445,118. Again, the time at which the pseudoranges are measured must be determined and transmitted to the remote processing station so that it can compute the positions of the GPS satellites at the measurement time of such pseudoranges, or, equivalently, the positions of the GPS satellites at the transmission times of the signals used for such pseudorange measurements.

Another alternative embodiment involves a GPS receiver in which raw GPS signal data is down converted to a suitable baseband, digitized and stored locally in a buffer memory. This data can then be sent, together with collection time information, via a communication link, to a remote processing station. The remote station then computes pseudoranges from this data, and utilizing satellite position information at the time of collection of the digitized data (e.g., from its own GPS receiver), computes the position of the remote receiver. Examples of this approach are disclosed in U.S. Pat. No. 5,420,592 to Russell K. Johnson, and U.S. Pat. No. 5,379,224 to Brown et al. Again, without accurate knowledge of the time at which the data was originally collected and stored in the buffer memory, the position calculation will be erroneous, due to errors in the GPS satellite location corresponding to the collected data.

Determining GPS Transmission or Reception Time

According to one embodiment of the present invention, in Global Positioning System systems utilizing combined GPS/communication receivers, such as the system illustrated in FIGS. 1 and 2, the GPS receiver does not derive an absolute time from the communication signal, but instead, coordinates its time with a GPS basestation which assists it in performing the position calculations.

If the communication system illustrated in FIG. 3 utilizes the European GSM cellular standard, the GPS receiver in mobile unit 302 may measure the time at which it measures pseudoranges relative to a GSM superframe time marker, for example. The GPS basestation 117 then sends the absolute time corresponding to this same marker over the cellular network to the GPS receiver, thereby establishing essentially absolute time at the receiver. Alternatively, the GPS receiver can send the pseudorange data to GPS basestation 117 over the cellular link together with the time of measurement relative to the superframe time marker. The GPS basestation 117 then utilizes this data together with satellite positioning data (known as ephemeris), which it can gather from its own GPS receiver 312 or another source, to compute the position of the remote GPS receiver in mobile unit 302. It will be appreciated that frames in these systems may typically serve a control signaling purpose for the cellular communication signal which uses or provides these frames. In a sense, these frames partition the data being transmitted in the cellular communication system.

The use of relative time measurements with respect to a time indicator and pseudorange calculation is also used in other cellular telephone systems, such as analog cellular systems. One such analog system is the North American analog cellular standard (AMPS). During a telephone call, signals are sent back and forth between the basestation and mobile station by analog frequency modulation (FM). Control signals are sent by blanking the FM signal (for around 50 milliseconds) and transmitting instead a burst of data. The timing of this burst can be arranged to be on a particular boundary (e.g., a one second boundary); alternatively the burst data can provide time-of-day information relative to the beginning of the burst. Both approaches would provide time dissemination in the manner previously described for digital cellular telephone systems. These approaches would require some alteration of the AMPS system since accurate time dissemination as described above is not currently required. Note that during call setup, the AMPS system uses continuous data transmission from the basestation on setup channels, and hence the methods described previously for the digital cellular systems may be applicable to this situation.

In the IS-95 CDMA cellular standard, and similar standards, system time is transmitted relative to particular timing markers, such as synchronization frame boundaries. In these systems, the remote GPS receiver 202 may be able to establish the absolute time of a pseudorange or GPS satellite position measurement made by the remote unit. In this case, relative time is not relied upon, and consequently, there is no need for both the remote GPS receiver 202 and GPS basestation 117 to coordinate time.

Figure 4A:
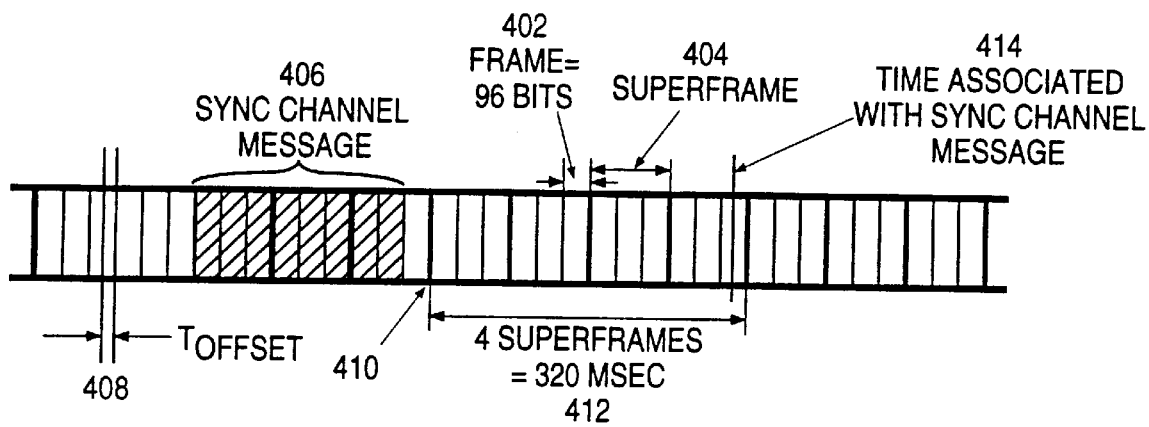
FIG. 4A illustrates the data structure of the IS-95 CDMA cellular telephone system.

FIG. 4A shows the data structure of a synchronization channel message for the North American IS-95 CDMA cellular standard. The data in these messages is contained in a series of 96 bit frames, such as frame 402. Three frames constitutes a superframe 404. An example of a data message is shown as region 406 in FIG. 4A. This data includes a system time message (equivalent to GPS time) plus an offset time 408 associated with the transmission time of the synchronization signal by a particular basestation, such as basestation 117 in FIG. 1. The end of the superframe containing the synchronization channel message plus a time equal to four additional superframes equals the system time plus the offset time (except for small propagation delays from basestation to mobile). Hence, in FIG. 4, system time 414 equals the end time 410 for the three superframes containing the synchronization channel message 406 plus the four superframes 412 following this end time 410, minus an amount of time equal to the offset time 408. Marker 414 indicates the measurement of system time in relation to synchronization channel message 406.

Thus, by synchronizing to the received synchronization signal and reading the data message, the cellular phone may precisely determine time, typically to within a few microseconds. According to one embodiment of the present invention, the combined GPS/communication receiver 200 incorporates a GPS receiver in an IS-95 CDMA system compatible cellular telephone. The cellular telephone receiver receives the synchronization signal from the cell basestation, and processor 212 within the combined GPS/communication receiver 200 performs the time determination. This time information may be used by the combined GPS/communication receiver 200 to determine the location of the receiver. Alternatively, for situations in which the final positioning operation is performed at a separate basestation, this timing information may be appended to GPS position data transmitted from the combined GPS/communication receiver to the basestation, as previously described with respect to FIGS. 1 and 3.

Figure 4B:
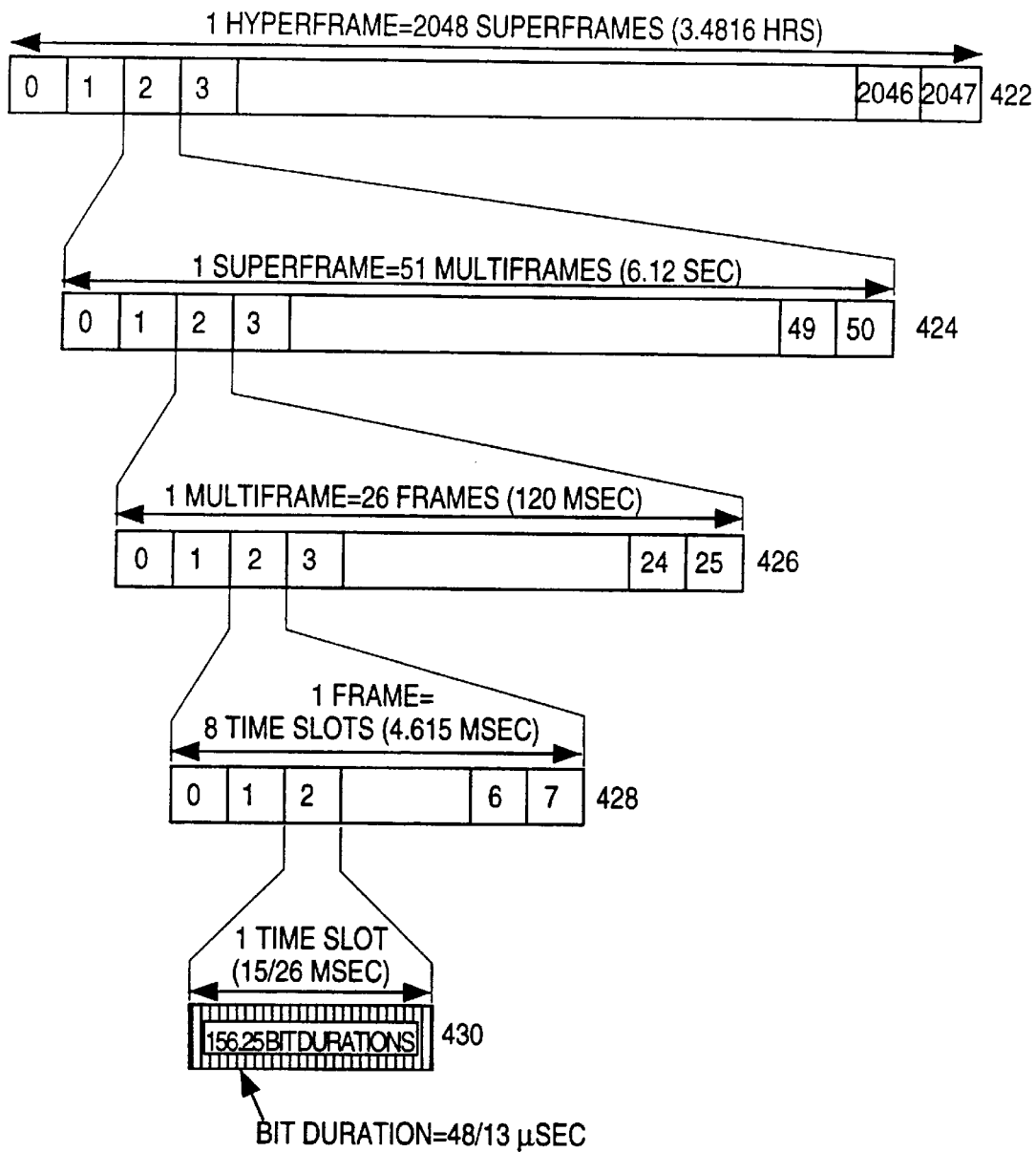
FIG. 4B illustrates the data structure of the GSM cellular telephone system.

FIG. 4B shows the data structure of a traffic channel for the European GSM cellular standard. The GSM standard utilizes a Time Division Multiple Access (TDMA) technique to utilize a communication channel. In the GSM system, data traffic is burst onto the channel at specific periods. A GSM burst lasts 0.577 milliseconds. In FIG. 4B, a data burst is illustrated as a time slot 430 containing 156.25 bit durations. The data in a GSM burst is contained in two subslots, each consisting of 57 bits. Each burst also contains signaling bits to indicate the type of traffic, and training bits which allow receivers to synchronize themselves to the burst.

Within the GSM message hierarchy, eight data bursts, or time slots, comprises a GSM frame 428 of 4.615 millisecond duration; 26 frames comprises a GSM multiframe 426 of 120 millisecond duration; 51 multiframes comprises a GSM superframe 424 of 6.12 second duration; and 2048 superframes comprises a GSM hyperframe 422 of 3.4816 hour duration.

The structures of the GSM broadcast control channel (for synchronization) and common control channel (for paging and access) are similar to the structure illustrated in FIG. 4B, except that one multiframe contains 51 TDMA frames and one superframe contains 26 multiframes. Thus the structure of the control channels is the opposite of the traffic channels with regard to the composition of the multiframes and superframes.

Because the GSM system contains well prescribed timing markers at various time instances, a cellular phone or receiver may lock onto various synchronization events and ascertain a local time indication. For example, the traffic multiframes which occur every 120 milliseconds, or the superframes which occur every 6.12 seconds, allow cell phones in the cell coverage area to ascertain time from network broadcasts transmitted by the cell basestation.

In one embodiment of the present invention, the combined GPS/communication receiver 200 incorporates a GPS receiver in a GSM system compatible cellular telephone. The cellular telephone receiver receives a network broadcast from the GSM basestation which contains a time indicator. Processor 212 within the combined GPS/communication receiver 200 calculates local time at the cellular phone by maintaining a counter and incrementing the time indication in the broadcast signal by the period of a particular synchronized event, such as a GSM superframe or multiframe. The counter is used to maintain a count of the number of frames in relation to the time indication. The calculated time can then be appended to GPS processed data (e.g., pseudoranges) to allow the computation of the receiver position, which may be performed within the combined GPS/communication receiver 200, or remotely at a GPS basestation 106. The determination of receiver position may be done locally at the receiver if the receiver possesses GPS satellite position information. If the receiver position is determined remotely, the processed data including the time tag are transmitted to the remote processing unit for completion of the position computation. This approach assumes that the various cell site transmissions are synchronized in time to one another so that the GPS receiver and basestation can coordinate their times from the network when they receive cell site transmissions from different cell sites. This synchronization is not always present in the GSM system, since it is optional. A method to overcome this limitation is discussed later.

It will be appreciated by those of ordinary skill in the art, that the technique of determining local time from a synchronized event such as a message frame or multiframe is applicable to communication systems which utilize time pulses, or the like, instead of a framing structure as in GSM. In these cases, the periodicity of the pulse is used with a time indicator to derive local time at the combined GPS/communication receiver.

Determining Remote Unit Position

Figure 5A:
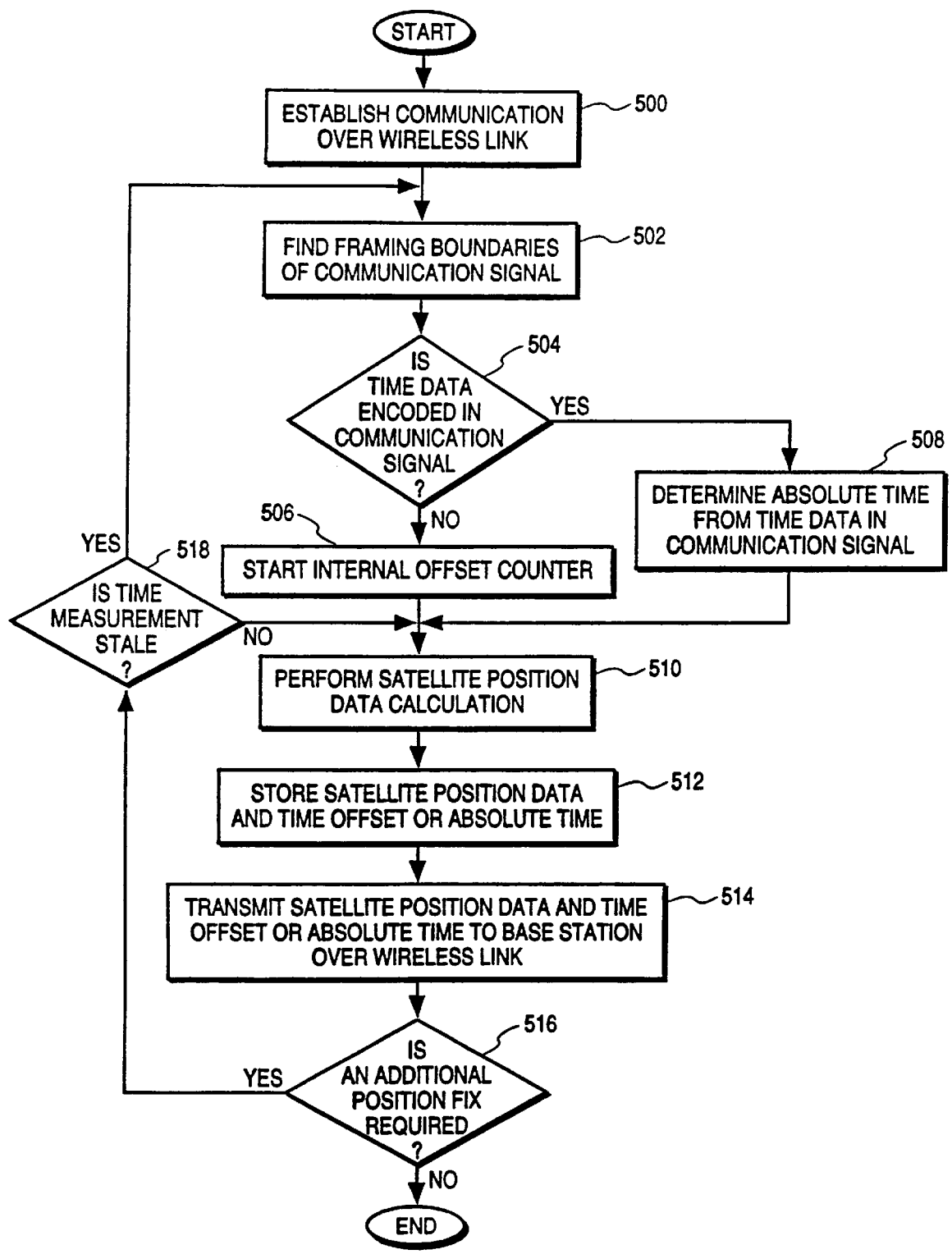
FIG. 5A is a flow chart of a method of deriving time information in a GPS receiver from communication signals which contain timing indicators, according to one embodiment of the present invention.

FIG. 5A is a flowchart illustration of a method according to one embodiment of the present invention of determining time in a remote combined GPS/communication receiver. The method of FIG. 5A will be discussed in relation to a combination GPS and cellular communication system as illustrated in FIG. 3. Mobile unit 302 contains a combined GPS/communication receiver as illustrated in FIG. 1, and will be referred to as the remote unit. The remote unit 302 first establishes a communication with the GPS basestation 117 over the wireless communication link, step 500. According to an embodiment of the present invention, this wireless communication link is a cellular telephone link. The specific cellular system or standard depends upon the region in which the system is deployed since cellular standards vary among different countries and regions. After remote unit 302 has established a communication link, it finds the framing boundaries within the communication signal transmitted by cell site 304, step 502. The framing boundaries serve as the time indicator which is the basis for deriving relative or absolute time related to GPS signal acquisition. In common digital cellular systems, the boundary to be found typically relates to a superframe or other similar type of data boundary. In common analog cellular systems, framing boundaries are typically not available, during voice conversations. Instead, bursts of data are typically inserted instead of voice data, as control signals. These may serve as boundaries of events which provide synchronization by their time of occurrence, either by synchronizing their occurrence to some repetitive interval (e.g., on one or five second boundaries) or by transmitting data indicating their time of occurrence.

In step 504, the remote unit 302 determines whether time data is encoded in the communication signal. If the cellular system utilizes the IS-95 CDMA or a similar standard, system time is transmitted relative to particular timing markers. Other systems, however, such as the European GSM standard do not transmit system time, and therefore the periodicity of the frames provides the only indication of data timing. If the cellular communication system does provide system timing, a processor within remote unit 302 can determine absolute time from the system time data and the timing markers, step 508. If the cellular communication system does not provide system timing, an internal offset counter may be started and maintained within remote unit 302, step 506. This internal offset counter should be used to provide timing offset information to the basestation to facilitate determination of time relative to a specific timing marker, which can be similarly observed and tagged by the GPS basestation 117.

In step 510, the remote unit 302 determines the satellite position data for corresponding satellites in view. The satellite position data may comprise spatial (x, y, z) coordinate data for each of the satellites. Alternatively, the satellite position data may comprise pseudoranges for each of the satellites. After determination of the satellite position data, the remote unit stores this data along with the appropriate time information, step 512. This time information consists of the timing offset generated in step 506 for cellular systems that do not transmit system time information. Alternatively, the timing information may be the absolute time determined in step 508 for cellular systems which do transmit timing information within the transmission signal. The stored satellite position information and time information is then transmitted to the GPS basestation 117 over the communication link, step 514. At step 516, the remote unit 302 determines whether an additional position fix is required. If an additional position fix is not required, the remote unit transmission process ends. If an additional position fix is required, the remote unit 302 next determines if the time data obtained from the previous time measurement is stale, step 518. Typically, an offset counter may be used to determine current time data from previous data if the previous data is still reliable. If the time data is still valid, the subsequent position fix is determined by proceeding with a new satellite position determination, step 510. The new satellite position data and the original time data as modified by the current value of the offset counter are then stored in the remote unit 302 and transmitted to basestation 117 over the communication link. If, in step 518, it is determined that the time data is no longer valid, the process recommences at step 502 where new time data is extracted from the communication signal. After determination of new time data and satellite position data for the additional position fix, this data is transmitted to basestation 117.

Figure 5B:
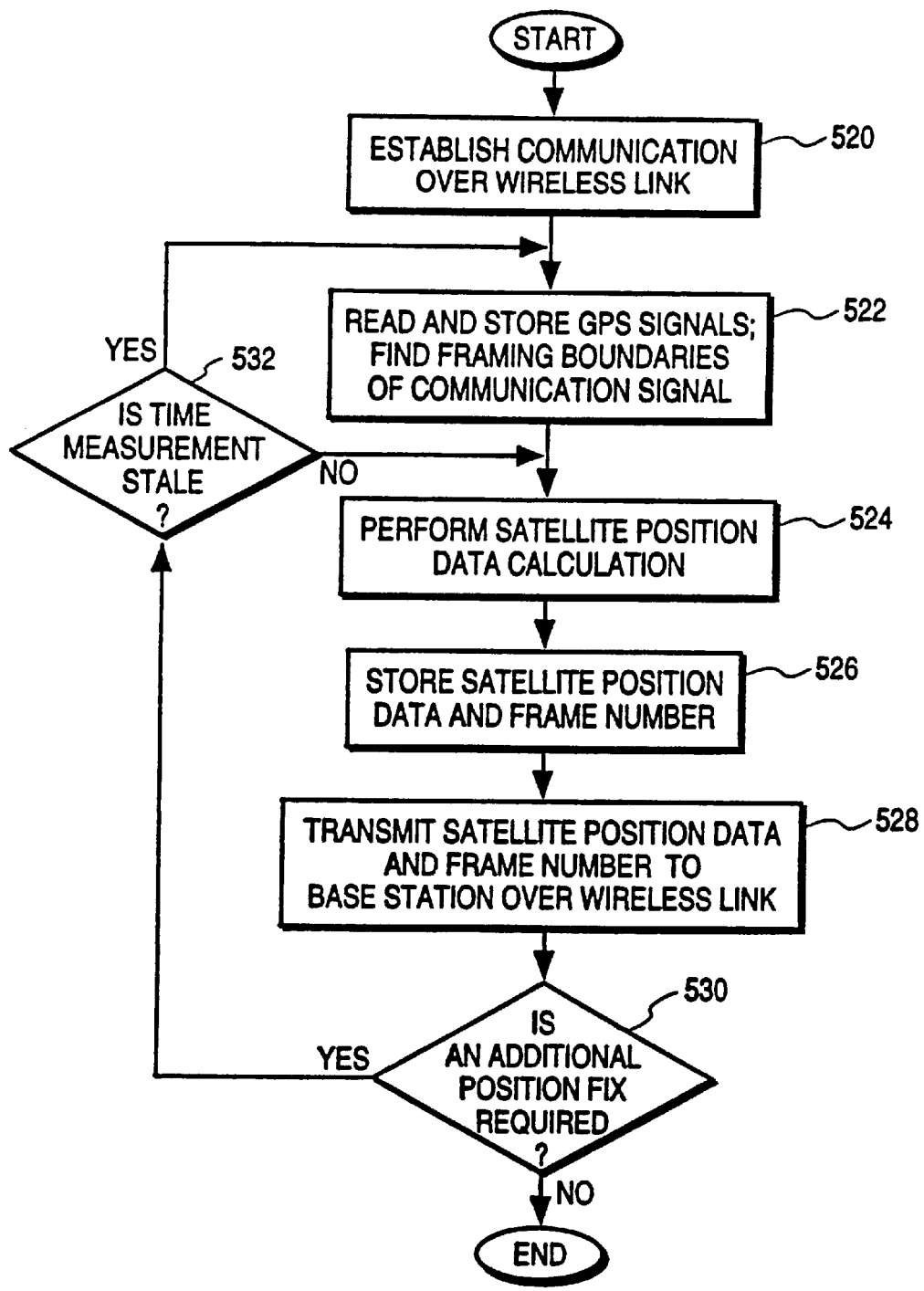
FIG. 5B is a flow chart of a method of deriving time information in a GPS receiver from communication signals which contain timing indicators, according to an alternative embodiment of the present invention.

FIG. 5B is a flowchart illustration of a method according to an alternative embodiment of the present invention of determining time in a remote combined GPS/communication receiver. As with FIG. 5A, the method of FIG. 5B will be discussed in relation to a combination GPS and cellular communication system as illustrated in FIG. 3. The remote unit 302 first establishes a communication with the GPS basestation 117 over the wireless communication link, step 520. For purposes of explanation, it will again be assumed that this wireless communication link is a cellular telephone link. According to this alternate embodiment of the present invention, it will further be assumed that absolute time is not contained in the communication signal, and that framing boundaries within the signal are used as timing indicators to derive time.

After remote unit 302 has established a communication link, it reads and stores GPS signals received from GPS satellites in view, step 522. In step 522, the remote unit also finds the framing boundaries within the communication signal transmitted by cell site 304. It is assumed that the GPS signals are received concurrently with the framing boundary of the communication signal so that there is effectively no delay between the timing indicator and the actual receipt of the GPS signal. In reality, however, there may be some offset time between the time of receipt of a GPS signal and the frame boundary. For example, if the GPS signal is received in the middle of a frame, there will be a half-frame offset before the next frame boundary which serves as the timing indicator. In some cellular systems, this offset may be appreciable enough to cause a significant error in the position calculation. In these cases, the remote unit 302 may maintain a delay counter which is initiated upon the receipt of a GPS signal and which maintains a count of the interval between the receipt of the GPS signal and the frame boundary. This delay counter should count in increments (e.g., 10 milliseconds) sufficient to resolve any inaccuracy introduced by the delay.

In step 524, the remote unit 302 determines the satellite position data for corresponding satellites in view. As stated above, the satellite position data may comprise spatial (x, y, z) coordinate data for each of the satellites, or it may comprise pseudoranges for each of the satellites. After determination of the satellite position data, the remote unit stores this data along with the appropriate time information, step 526. The time information in this alternative embodiment consists of the number of the frame whose later boundary serves as the timing indicator. The stored satellite position information and frame number is then transmitted to the GPS basestation 117 over the communication link, step 528. The GPS basestation 117 uses the frame number to match frames and synchronize a count to determine absolute time.

At step 530, the remote unit 302 determines whether an additional position fix is required. If an additional position fix is not required, the remote unit transmission process ends. If an additional position fix is required, the remote unit 302 next determines if the time data, e.g. framing boundary location, obtained from the previous time measurement is stale, step 532. If the time data is still valid, the subsequent position fix is determined by proceeding with a new satellite position determination, step 524. In all cases we assume that the delay counter is continuously running. The new satellite position data and the original time data (frame number) are then stored in the remote unit 302 and transmitted to basestation 117 over the communication link. If, in step 532, it is determined that the time data is no longer valid, the process recommences at step 522 where new framing boundary data is extracted from the communication signal. After determination of new frame boundary and satellite position data for the additional position fix, this data is transmitted to basestation 117, step 528.

Figure 6:
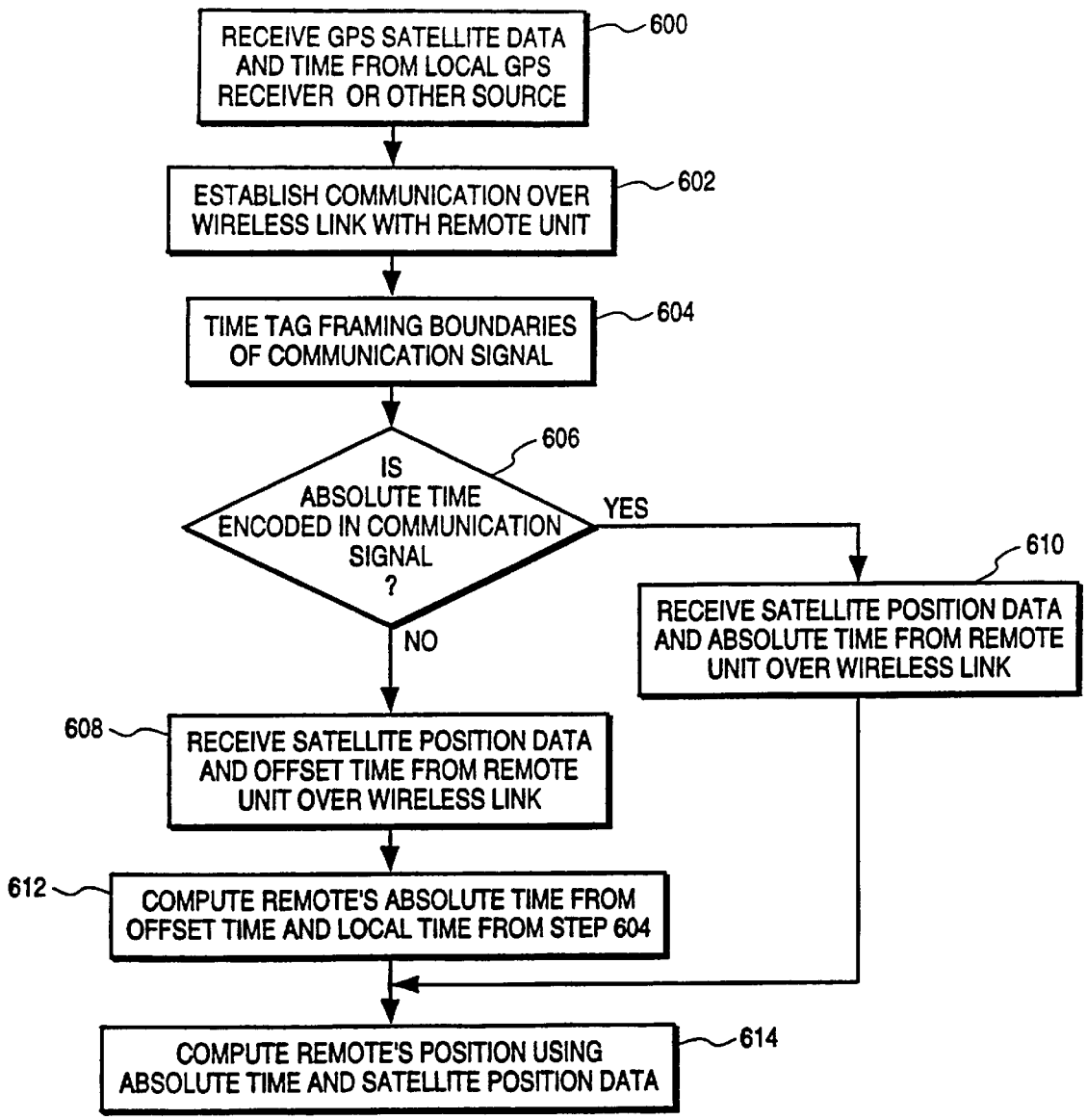
FIG. 6 is a flow chart of a method of determining the position of a GPS receiver in a GPS server which receives satellite and derived time data from the GPS receiver.

FIG. 6 is a flowchart illustration of a method according to one embodiment of the present invention of computing the position of a remote combination GPS/communication receiver in a GPS basestation. As with FIGS. 5A and 5B, the method of FIG. 6 will be discussed in relation to a combination GPS and cellular communication system as illustrated in FIG. 3. The GPS basestation 117 receives GPS satellite data and GPS time data from a local GPS receiver 312, step 600. If a local GPS receiver such as GPS receiver 312 is not available, GPS basestation 117 may receive this information from other sources, such as remote GPS receivers other than remote unit 302. GPS basestation 117 maintains current data related to the GPS signals acquired and maintained by the GPS signal source (e.g., GPS receiver 312). GPS basestation 117 then establishes communication with remote unit 302 over the communication link, step 602. This step establishes the two-way communication link between basestation 117 and remote unit 302 initiated by remote unit 302 in step 500 of FIG. 5A or step 520 of FIG. 5B.

In step 604, GPS basestation 117 time tags the framing boundaries of the communication signal. To ensure accurate synchronization, the framing boundaries time tagged by GPS basestation 117 should have a known relationship to the framing boundaries found by remote unit 302 in step 502 of FIG. 5A. This may be performed as shown in FIG. 3 wherein the GPS basestation 117 receives samples of the communication signals either from a cell site or from a cellular receiver (e.g. cell phone 314). In step 606, GPS basestation 117 determines whether absolute time data is encoded in the communication signal. If absolute time data is encoded in the communication signal, GPS basestation 117 receives the satellite position data and absolute time from remote unit 302, step 610. The data received in this step corresponds to the data transmitted by remote unit 302 in step 514 of FIG. 5A, in which the absolute time was that calculated by remote unit 302 in step 508. If time data is not encoded in the communication signal, GPS basestation 117 receives from the remote unit (in step 608) the satellite position data, an identifier of a time indicator and offset time (if any) from the indicator. The data received in this step corresponds to the data transmitted by remote unit 302 in step 514 of FIG. 5A, in which the offset time is derived from the internal offset counter started by remote unit 302 in step 506. If GPS basestation 117 receives an offset time as the time data, it computes, in step 612, the absolute time for remote unit 302 based on the offset time and local time, as previously found in step 604. It is assumed that basestation 117 has precise knowledge of its own local time through use of its own timing source (such as a GPS receiver) or timing data provided to it by another communications link (such as cellular phone 314). Once absolute time for the remote is ascertained by GPS basestation 117, either by internal computation of step 612 or directly from remote unit 302 in step 610, the basestation computes the position of remote unit 302 using this absolute time and the satellite position data received from remote unit 302, step 614.

In an alternative embodiment of the present invention corresponding to transmission of time and GPS data in accordance with FIG. 5B, GPS basestation 117 receives the frame number corresponding to the framing boundary of the communication signal, step 608. This frame number, which was transmitted by the remote unit in step 528 of FIG. 5B, serves as the timing indicator for the calculation of the remote unit location. GPS basestation 117 may also receive a count for a delay counter if the GPS signal was received in the remote unit 302 with an offset between the reception time and the frame boundary, as discussed above. GPS basestation 117 matches the frame number with the corresponding frame which it has received from an independent source of the communication signal (e.g., cellular phone 314). It also takes into account any delay offset, and then determines the absolute time for remote unit 302 based on the frame number and any offset delay. Once absolute time for the remote is ascertained by GPS basestation 117, the basestation computes the position of remote unit 302 using this absolute time and the satellite position data received from remote unit 302, as shown in step 614 of FIG. 6.

In some cellular systems absolute time is not coordinated from one cell site to the next, even though it may be maintained with high relative position (i.e., high stability) within a given cell. Hence, it may be difficult for a remote GPS receiver to coordinate its time with a GPS basestation unless that GPS basestation has access to the timing information of the cell site in which the remote is located. In one embodiment of the present invention, this problem is partially solved by having a series of cellular telephones located in each cell of a coverage area serviced by a cellular switching center. Each of these telephones determine the cell timing for its specific cell. If the cell associated with the remote GPS receiver is known, then the absolute time for that cell may be coordinated between a GPS basestation and a remote unit, independently of the location of the remote unit within the cell.

Doppler Data Transmission

According to an alternative embodiment of the present invention, the method of the present invention may be used in conjunction with a method for reducing processing time due to Doppler error in a satellite positioning system (SPS) receiver having a cell based communication receiver, such as is described in co-pending U.S. patent application entitled, "An Improved GPS Receiver Utilizing a Communication Link" by Norman F. Krasner which was filed Apr. 15, 1997 and received Ser. No. 08/842,559, and which is hereby incorporated herein by reference. Methods for using Doppler information transmitted to a SPS receiver having a cellular receiver are also described in co-pending U.S. patent applications Ser. No. 08/612,582, filed Mar. 8, 1996, and Ser. No. 08/759,523 filed on Dec. 4, 1996, and both of these applications are entitled "An Improved GPS Receiver Utilizing a Communication Link" and both are hereby incorporated herein by reference. One method includes determining an approximate location of a GPS receiver from a cell based information source. This approximate location is determined by using at least one of a location of a cellular service area which includes a cell site which is capable of communicating with the cell based communication receiver or a location of the cell site itself. The method further includes determining an approximate Doppler for at least one GPS satellite relative to the GPS receiver, where the approximate Doppler is based upon the approximate location. This approximate Doppler is used in the GPS receiver to reduce processing time in either determining at least one pseudorange to the at least one GPS satellite, or in acquiring signals from the at least one GPS satellite.

An exemplary embodiment of this method is a cellular telephone which includes a GPS receiver. The cellular telephone operates by communicating with cell sites, each of which are connected to a cellular switching center. A database, which represents a cellular based information source, may be maintained at the cellular switching center or at the cell site or at a remote processing station, which may be termed a "server," may be used to determine an approximate location of the cellular telephone based upon the cell site (or cellular service area) with which the cellular telephone is communicating. This approximate location may then be used to derive an approximate Doppler relative to the various GPS satellites which are transmitting GPS signals to the GPS receiver in the cellular telephone. This approximate Doppler is then transmitted in one embodiment from the cell site to the cellular telephone, and is then used in the GPS receiver in order to reduce processing time due to Doppler induced effects in the GPS receiver.

A further embodiment of this aspect of the present invention is a data processing station which includes a processor and a storage device coupled to the processor, and a transceiver coupled to the processor. The transceiver is for coupling the data processing station to a wireless cell site. The storage device contains information specifying at least one approximate Doppler at a given time for an approximate location which is determined by at least one of a location of a cellular service area which includes the wireless cell site or a location of the wireless cell site itself. The transceiver receives a site information which determines the approximate location, and the processor determines an approximate Doppler for at least one GPS satellite which is in view of said approximate location. The approximate Doppler is based upon the approximate location. The transceiver sends this approximate Doppler to the wireless cell site which then transmits the approximate Doppler to a cell based communication receiver which is coupled to a GPS receiver.

Another aspect of the present invention relates to a method for providing a local oscillator signal in a mobile satellite positioning system receiver. The method includes receiving a signal having a carrier frequency and a data signal modulated on the carrier frequency, extracting a reference signal from the data signal modulated on the carrier frequency, and using the reference signal to provide a local oscillator signal to acquire GPS signals from GPS satellites.

Another embodiment according to this aspect of the present invention, is a combined GPS receiver and communication system. The communication system includes an acquisition and tracking circuitry which is coupled to an antenna to receive the communication signals. This acquisition and tracking circuitry acquires and tracks the data signal which is modulated onto a carrier frequency and provides a reference signal from the data signal modulated on the carrier frequency. The reference signal is then provided to a phase locked loop or to a frequency synthesizer in order to generate a local oscillator signal which is used to acquire GPS signals in the GPS receiver.

In another aspect of the present invention, a method for determining a position of a GPS receiver having a wireless cell based transmitter is described. This method includes determining an approximate location of the GPS receiver from a cell based information source. The approximate location is determined by at least one of a location of a cellular service area which includes a wireless cell site which is capable of communicating with the cell based transmitter or a location of the wireless cell site. The GPS receiver receives a source of GPS signals and determines a plurality of pseudorange data and transmits this plurality of pseudorange data to the wireless cell site. Then a position of the SPS receiver is computed by using the GPS signals, the plurality of pseudoranges and the approximate location. In this method, the approximate location is used to facilitate convergence of the position calculation.

In another aspect of the present invention, a method for providing Doppler information to an GPS receiver is described. In this method, a plurality of approximate Doppler data from an approximate location is determined. This approximate location is based upon at least one of a location of a wireless cell site or a location of a cellular service area which includes the wireless cell site. The plurality of approximate Doppler data is for a corresponding plurality of satellites. The method further includes broadcasting the plurality of approximate Doppler data from a wireless cell transmitter of the wireless cell site to a plurality of GPS receivers in a cell serviced by the wireless cell site. Typically, at least in one embodiment, the cell site would then receive a plurality of pseudoranges and would forward these pseudoranges to a remote processing station in which the position of the GPS receiver is computed using the GPS signals and the pseudoranges.

In yet another aspect of the present invention, a method for providing satellite information to a GPS receiver is described. This method includes determining an approximate location from a cellular based information source and determining a plurality of satellite ephemeris data for a corresponding plurality of satellites which are in view of the approximate location. The method further includes transmitting the plurality of satellite ephemeris data from a wireless cellular transmitter of the wireless cell site to a GPS receiver in a cell serviced by the wireless cell site.

In yet another aspect of the present invention the approximate location, which is derived from a cell based information source, is used to select a particular set of differential GPS correction data.

FIG. 7 shows an example of a cellular based information source which in one embodiment may be maintained at a GPS server such as the GPS server basestation 117 shown in FIG. 3. Alternatively, this information source may be maintained at a cellular switching center such as the cellular switching center 308 of FIG. 3 or at each cell site, such as cell site 304 shown in FIG. 3. Typically, however, this information source is maintained and routinely updated at the GPS server which is coupled to the cellular switching center. The information source 700 may maintain the data in various formats and it will be appreciated that the format shown in FIG. 7 illustrates only one example of this format. Typically, each set of Doppler information at a particular time 710, such as Doppler set A1 at time T1 will include a corresponding location or identification for a cell site or a service area. For example, in the case of Doppler sets A1 and A2 there is a corresponding identification of the cellular service area A as well as the latitude and longitude for this service area. It will be appreciated that typically this latitude and longitude will be an "average" location which is generally centrally located within the geographical region of the cellular service area. However, other possible approximations may be utilized particularly where the cellular service area includes terrain which is not used. As shown in FIG. 7, the cellular based information source includes a column specifying the cellular service area, column 702, and a column 704 specifying a cellular site identification or number. Note that for cellular service area A there is no specification of the cell site identification or location and thus the approximate location is based upon a location for the cellular service area and thus the approximate Dopplers A1 and A2 are based upon this location depending on the particular time of day designated by the times T1 and T2. The column 706 includes a specification of the latitude and longitude for the particular location of the service area, and column 708 includes a specification of the latitude and longitude for the location of the particular cell site within the cellular service area.

Although the methods and apparatus of the present invention have been described with reference to GPS satellites, it will be appreciated that the teachings are equally applicable to positioning systems which utilize pseudolites or a combination of satellites and pseudolites. Pseudolites are ground based transmitters which broadcast a PN code (similar to a GPS signal) modulated on an L-band carrier signal, generally synchronized with GPS time. Each transmitter may be assigned a unique PN code so as to permit identification by a remote receiver. Pseudolites are useful in situations where GPS signals from an orbiting satellite might by unavailable, such as tunnels, mines, buildings or other enclosed areas. The term "satellite", as used herein, is intended to include pseudolites or equivalents of pseudolites, and the term GPS signals, as used herein, is intended to include GPS-like signals from pseudolites or equivalents of pseudolites.

In the preceding discussion the invention has been described with reference to application upon the United States Global Positioning Satellite (GPS) system. It should be evident, however, that these methods are equally applicable to similar satellite positioning systems, such as the Russian Glonass system. The term "GPS" used herein includes such alternative satellite positioning systems, including the Russian Glonass system. The term "GPS signals" includes signals from alternative satellite positioning systems.

In the foregoing, a system has been described for determining time for a GPS receiver using commercially available transmission signals. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than restrictive sense.

What is claimed is:

1. A system for determining a position of a mobile global positioning system receiver, said mobile global positioning system receiver receiving global positioning system signals from at least one of a plurality of global positioning system (GPS) satellites, said system comprising:

means for receiving a cellular communication signal in a mobile communication receiver coupled to said mobile global positioning system receiver, said cellular communication signal having a time indicator which represents a time event;

means for associating said time indicator with data representing a time of arrival of a GPS satellite signal at said mobile global positioning system receiver; and means for determining a position information of said mobile global positioning system receiver, wherein said data representing said time of arrival of said GPS satellite signal and said time indicator are used to determine said position information of said mobile global positioning system receiver and wherein said cellular communication signal supports 2-way communications;

wherein said means for receiving, said means for associating and said means for determining are performed by a single processor device.

2. The system according to claim 1 wherein said cellular communication signal is a cellular telephone signal, and said time indicator is a frame which partitions data transmitted in said cellular telephone signal.

3. The system according to claim 2 wherein said means for associating said time indicator comprises means for initiating an internal count in a counter, wherein the count in said counter corresponds to the elapsed time from said time event represented by said time indicator, to a time of measurement by said mobile global positioning system receiver.

4. The system according to claim 1 wherein said cellular communication signal is a cellular telephone signal, and said time indicator is system time information which is transmitted in said cellular communication signal.

5. The system according to claim 4 wherein said means for associating said time indicator comprises means for decoding said system time information as local time.

6. The system according to claim 1 wherein said data representing said time of arrival of said GPS satellite signal is obtained from pseudorandom sequences of said GPS satellite signal received by said mobile global positioning system receiver.

* * * * *

UNITED STATES PATENT AND TRADEMARK OFFICE
CERTIFICATE OF CORRECTION

PATENT NO. : 6,150,980
DATED : November 21, 2000
INVENTOR(S) : Krasner

It is certified that error appears in the above-identified patent and that said Letters Patent is hereby corrected as shown below:

<u>Title page,</u>
Item [63], Related U.S. Application Data, please delete "Apr. 24, 1992" and insert -- Apr. 24, 1997 --.

Signed and Sealed this

Second Day of August, 2005

JON W. DUDAS
*Director of the United States Patent and Trademark Office*